(12) United States Patent
Stubbs

(10) Patent No.: US 6,838,712 B2
(45) Date of Patent: Jan. 4, 2005

(54) PER-BIT SET-UP AND HOLD TIME ADJUSTMENT FOR DOUBLE-DATA RATE SYNCHRONOUS DRAM

(75) Inventor: Eric T. Stubbs, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/994,205

(22) Filed: Nov. 26, 2001

(65) Prior Publication Data

US 2003/0099135 A1 May 29, 2003

(51) Int. Cl.[7] .............................................. H01L 29/73
(52) U.S. Cl. ...................... 257/208; 257/194; 257/203; 257/204; 365/194; 365/233
(58) Field of Search ................................ 257/194, 203, 257/204, 208; 365/194, 233

(56) References Cited

U.S. PATENT DOCUMENTS

| | | | | |
|---|---|---|---|---|
| 5,657,481 A | * | 8/1997 | Farmwald et al. | 395/551 |
| 5,692,165 A | * | 11/1997 | Jeddeloh et al. | 395/551 |
| 5,694,065 A | * | 12/1997 | Hamasaki et al. | 327/108 |
| 5,813,023 A | * | 9/1998 | McLaury | 711/105 |
| 5,920,518 A | * | 7/1999 | Harrison et al. | 365/233 |
| 6,040,713 A | | 3/2000 | Porter et al. | 326/83 |
| 6,130,856 A | * | 10/2000 | McLaury | 365/233 |
| 6,137,334 A | | 10/2000 | Miller, Jr. et al. | 327/271 |
| 6,145,418 A | | 11/2000 | Li | 365/233 |
| 6,201,424 B1 | * | 3/2001 | Harrison | 327/159 |
| 6,282,132 B1 | | 8/2001 | Brown et al. | 365/193 |
| 6,434,081 B1 | * | 8/2002 | Johnson et al. | 365/233 |

* cited by examiner

*Primary Examiner*—Van Thu Nguyen
*Assistant Examiner*—Douglas Menz
(74) *Attorney, Agent, or Firm*—Wong, Cabello, Lutsch, Rutherford & Brucculeri, LLP

(57) ABSTRACT

A synchronous double-data-rate semiconductor memory device is adapted to receive write data on both the rising and falling edges of a data strobe signal derived from an externally-applied system clock. In the write path circuitry for each data pin of the device, adjustable delay elements are provided to enable the adjustment of the setup and hold times of write data applied to the data pin relative to the data strobe signal. The delays are separately adjustable for data present during the rising edge of the data strobe signal and for data present during the falling edge of the data strobe signal. The setup and hold window for write data is thus optimizable on a per-bit basis rather than a per-cycle basis. In one embodiment, a delay circuit is provided for generating delaying the rising edge data and the falling edge data by different delay intervals.

14 Claims, 4 Drawing Sheets

PER-BIT SET-UP AND HOLD TIME ADJUSTMENT FOR DOUBLE-DATA RATE SYNCHRONOUS DRAM

FIELD OF THE INVENTION

This invention relates generally to semiconductor devices, and more particularly relates to synchronous semiconductor memory devices.

BACKGROUND OF THE INVENTION

The field of semiconductor memory devices is enormously active and rapidly developing. Various categories and sub-categories of semiconductor devices are known and commercially available. The ever-increasing popularity and ubiquity of computers and computer-based devices, both in the consumer and industrial realms, is such that the demand for semiconductor memory devices of a variety of different types will continue to grow for the foreseeable future.

One of the more common categories of semiconductor memory devices used today is the dynamic random access memory, or DRAM. Among the desirable characteristics of any DRAM are a high storage capacity per unit area of semiconductor die area, fast access speeds, low power consumption, and low cost.

One approach that has been used to optimize the desirable properties of DRAM has been to design such devices such that they are accessible synchronously. A synchronous DRAM typically requires an externally-applied clocking signal, as well as other externally-applied control signals whose timing must bear certain predetermined relationships with the clock signal. Likewise, digital data is read from and written to a synchronous memory device in a synchronous relationship to the externally-applied clock signal. Synchronous DRAM technologies have been under development for many years, and synchronous DRAM (frequently referred to as "SDRAM") is used in a broad spectrum of commercial and industrial applications, including the personal computer industry.

In typical implementations, the external clock signal CLK comprises a simple, periodic "square" wave, such as shown in FIG. 3a, oscillating with reasonably uniform periodicity between a logical high voltage level (for example, 3.3V) and a logical low level (typically 0V) with a duty cycle of 50% (meaning that the signal is at a logical "high" level the same amount of time that it is at a logical "low" level during each complete clock cycle). In present state-of-the-art semiconductor devices, the clock signal may have a frequency on the order of hundreds of megahertz.

A synchronous semiconductor device such as an SDRAM will typically require an external input signal such as a clock signal to be provided to several (or even numerous) separate but interrelated functional subcircuits of the device. As a matter of ordinary semiconductor device layout, it is typical for each of the separate subcircuits of an overall device to be physically disposed at different and perhaps distributed locations throughout the substrate as a whole. This means that the conductive lengths, and hence such characteristics as capacitive and complex impedance loads of the various conductive traces which carry electrical signals throughout the substrate, will vary from signal to signal. Hence, for example, the propagation delay of a clock signal from a clock signal input pin to one functional subcircuit may be different than the propagation delay to another functional subcircuit; such differences can be critical for devices operating at very high clock rates, on the order of 100 MHz or so (and perhaps less).

To address such considerations, an approach referred to as "delay-locked loop" or "DLL" can be employed. FIG. 1 is illustrative of a simple example of DLL implementation. In FIG. 1, an externally-applied clock signal CLK is applied to an input pin 12 of a hypothetical memory device 10. As shown in FIG. 1, the externally-applied CLK signal is applied to a DLL block 20. DLL block 20 operates to derive a plurality of separate internal clock signals which are then provided to the various subcircuits of memory device 10 on lines 22, 24, and 26. (Although only three internal clock signals are depicted in FIG. 1, those of ordinary skill will appreciate that more than three internal clock signals may be required in any given implementation.) The function of DLL block 20 (which may represent circuitry distributed throughout the area of the substrate, notwithstanding the centralized location represented for convenience in FIG. 1) is to adjust the relative timing of the clock signals provided on lines 22, 24, and 26 to the various distributed subcircuits of device 10 such that overall synchronous operation of the device 10 can be achieved.

DLL blocks such as DLL block 20 in FIG. 1 may utilize some type of loop-back operation, as represented by exemplary dashed line 28 in FIG. 1, whereby DLL block 20 is provided with feedback for comparing the timing of the clock signal supplied on line 22 to command block 14 with the timing of incoming external clock signal CLK.

In the simplified example of FIG. 1, since command input buffer 14 and data input buffer 16 each receive and operate based on a clock signal, the command (CMD) input pin 15 and data (DATA) input pin 17 are said to be synchronous inputs. As such, binary data applied to input pins 15 and 17 will only be stored in the respective buffers 14 and 16 (a process sometimes referred to as "signal capture") upon a rising or falling edge of the corresponding internal clock signal.

As a result of the functionality of a typical DLL circuit such as DLL block 20 in FIG. 1, if the propagation and loading characteristics of line 22 varies significantly from that of, say, lines 24 and 26, DLL circuit can account for such differences in order to ensure that proper device operation can be maintained. Internally to DLL circuit 20, separate delays and skews (programmable, or automatically adjusted) may be introduced into the externally-applied clock signal to ensure that each of the other functional blocks in device 10 receives clock signals that are substantially synchronized with the others. The delays and skews introduced by a DLL may be miniscule, on the order of picoseconds, but may be nonetheless critical to the proper operation of a semiconductor device.

The functionality of DLLs can be thought of generally as a process of internal clock signal generation, and those of ordinary skill in the art will doubtless be familiar at least generally with the concept of DLLs in semiconductor devices. Various examples of DLL implementations for synchronous memory devices are proposed in U.S. Pat. No. 5,920,518 to Harrison et al., entitled "Synchronous Clock Generator Including Delay-Locked Loop;" U.S. Pat. No. 6,201,424B1 to Harrison, entitled "Synchronous Clock Generator including a Delay-Locked Loop Signal-Loss Detector;" and U.S. Pat. No. 6,130,856 to McLaury, entitled "Method and Apparatus for Multiple Latency Synchronous Dynamic Random Access Memory." The aforementioned '518, '424, and '856 patents are each commonly assigned to the Assignee of the present invention and each are hereby incorporated by reference herein in their respective entireties.

Those of ordinary skill in the art will appreciate that in conventional synchronous DRAMs, data presented to the data input/output (DQ) pins is written into a data buffer during either the rising or falling edge of the external clock signal. On the other hand, a recent development in the evolution of synchronous DRAM technology is the so-called "double data rate (DDR) DRAM. In DDR DRAMs, data is written into data buffers on both the rising and falling edges of each clock cycle, thus providing twice as much data as a conventional SDRAM for a given system clock speed. One example of a DDR SDRAM is disclosed in U.S. Pat. No. 6,154,418 to Li, entitled "Write Scheme for a Double Data Rate SDRAM," which is commonly assigned to the assignee of the present invention and hereby incorporated by reference herein in its entirety.

Due to the high speed data transfers, DDR SDRAMs use a bi-directional data strobe signal (DQS) to register the data being input or output on both edges (rising and falling) of a system clock. According to industry standards, when data is being received by a DDR SDRAM, the DQS has a known latency which can vary between ¾ of a system clock cycle (minimum latency) to 5/4 of the clock cycle (maximum latency). When data is being received by a DDR SDRAM, the system clock cannot be properly synchronized with the DQS because of the latency variation and thus, the system clock cannot be properly synchronized with the input data.

Two parameters of significance to the process of writing data to a DDR DRAM are the setup and hold times specified for the data that is presented to the input buffer. The setup time (DS) is the minimum time in advance of the latching clock (data strobe) edge that valid data must be present at the input buffer's input. The hold time (DH) is the minimum time following the latching clock edge that the data must be present at the input buffer's input. Together, the setup and hold times define a "window" surrounding the data clock edge (rising or falling) during which the data on the data line (DQ) must be valid.

One scheme for clocking data into a DDR DRAM uses a delay element in the write data path to internally delay data relative to the data strobe. By making the delay element variable, the input setup and hold times can be adjusted to ensure that specified setup and hold times are achieved. However, experimental data shows that the setup and hold window can be different for the data clocked in on the rising edge than for the data clocked in on the falling edge. The net effect of this phenomenon is that the total setup and hold window for the input pin is the overlap of the windows for the two clock edges, which can be larger than permissible according to the memory device's specification. Adjustments to the single delay element can help the worst-case setup or hold, but improvement to one (setup or hold) can only be achieved to the detriment of the other.

Thus, it is believed that there remains a need for an improved method and apparatus by which data is clocked in to a DDR DRAM.

SUMMARY OF THE INVENTION

The present invention relates to an apparatus and corresponding method by which data is written to a synchronous, double-data-rate semiconductor memory device.

In accordance with one aspect of the invention, a write data path circuit is provided for each input/output terminal of the memory. The write data path circuit includes an input buffer having an output coupled to respective inputs of first and second adjustable delay elements. The output of the first and second delay elements, in turn, are coupled to respective first and second pass gates. The pass gates operate to open and close in response to a data strobe signal applied to a control input. The delay value of the first delay is adjustable to allow a first bit of data applied to the input/output terminal to appear at the input of the first pass gate in a predetermined timed relationship with a rising edge in the data strobe signal, such relationship corresponding to the specified setup and hold window for the device. Similarly, the delay value of the second delay is adjustable to allow a second bit of data applied to the input/output terminal to appear at the input of the second pass gate in a predetermined timed relationship with a falling edge of the data strobe signal, this relationship again corresponding to the specified setup and hold window for the device.

In accordance with another aspect of the invention, a delay circuit is provided having an input coupled to the input buffer associated with a data input/output terminal, and having first and second outputs coupled to the respective inputs of the first and second pass gates. The delay circuit comprises a plurality of individual, series-connected delay elements, with a plurality of tap points being defined between adjacent pair of delay elements. Each tap point can be shunted to either the input of the first pass gate or the input of the second pass gate. The amount of delay introduced into propagation of the rising edge data depends upon which tap point is shunted to the input of the first pass gate, whereas the amount of delay introduced into propagation of the falling edge data depends upon which tap point is shunted to the input of the second pass gate. In this way, one group of series-connected delay elements is utilized to generate two separately delayed signals.

BRIEF DESCRIPTION OF THE DRAWINGS

The foregoing and other features and aspects of the present invention will be best understood with reference to the following detailed description of a specific embodiment of the invention, when read in conjunction with the accompanying drawings, wherein.

DETAILED DESCRIPTION OF SPECIFIC EMBODIMENTS OF THE INVENTION

In the disclosure that follows, in the interest of clarity, not all features of actual implementations are described. It will of course be appreciated that in the development of any such actual implementation, as in any such project, numerous engineering and programming decisions must be made to achieve the developers' specific goals and subgoals (e.g., compliance with system and technical constraints), which will vary from one implementation to another. Moreover, attention will necessarily be paid to proper engineering practices for the environment in question. It will be appreciated that such a development effort might be complex and time-consuming, but would nevertheless be a routine undertaking for those of ordinary skill in the relevant fields.

Figure 1:
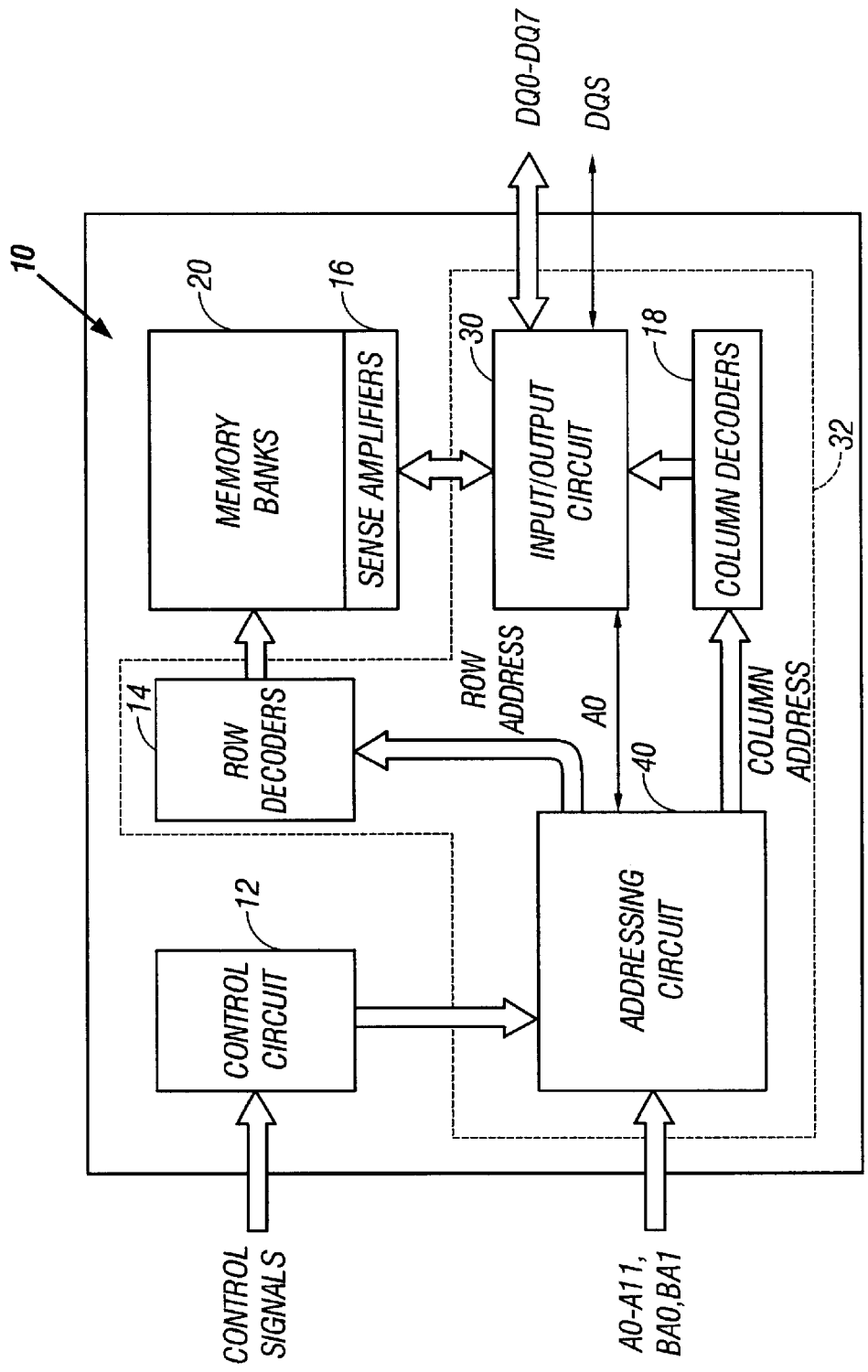
FIG. 1 is a schematic/block diagram of a semiconductor memory device in accordance with one embodiment of the invention.

Referring to FIG. 1, there is shown a highly simplified schematic/block diagram of a semiconductor memory device 10 in accordance with one embodiment of the invention. In the disclosed embodiment, memory device 10 is a double data rate (DDR) synchronous dynamic random access memory (SDRAM), although those of ordinary skill in the art having the benefit of the present disclosure will appreciate that the invention may not be limited in scope to application in SDRAM only. It will also be understood that SDRAM 10 incorporates a substantial amount of circuitry in addition to those functional components specifically represented in FIG. 1. However, such other circuitry has been omitted in the interests of brevity and clarity, since such circuitry is well-known to those of ordinary skill in the art and is not especially relevant to the practice of the present invention.

Memory device 10 includes a control circuit 12, addressing circuit 40, input/output circuit 30, memory banks 20, sense amplifier circuits 16, column decoders 18 and row decoders 14. In a preferred embodiment, four memory banks 20, sense amplifier circuits 16, column decoders 18 and row decoders 14 are used, but for convenience purposes only, FIG. 1 illustrates one memory bank 20, sense amplifier circuit 16, column decoder 18 and row decoder 14. In a preferred embodiment, four memory banks 20 are used, but it must be noted that the present invention can utilize, for example, one, two, four, eight or more memory banks 20. The row and column decoders 14, 18, addressing circuit 30 and input/output logic circuit 30 comprise a write path circuit 32 providing a data path for writing data into the banks 20 from an external device (through input/output pins DQ0–DQ7). It is to be noted that the illustrated configuration of the write path circuit 32 is but one of many possible configurations and the invention is not to be so limited to the specific circuit illustrated in FIG. 1.

In one embodiment, memory device 10 contains eight input/output pins DQ0–DQ7. This is referred to as a "by 8" device since eight bits are input or output at one time. It must be noted that the SDRAM 10 can also be configured to have fewer than eight input/output pins (e.g., a "by 4" device) or greater than eight input/output input/output pins (e.g., a "by 16" device).

Control circuit 12 is coupled to address circuit 40 and receives various external control signals as inputs. By way of example but not limitation, control circuit 52 may receive a chip select (CS#) signal and a RESET signal, row and column address strobe (RAS and CAS) signals, a write enable (WE#) signal, and so on. Those of ordinary skill in the art will be familiar with the various control signals applied to device 10. Although not shown in FIG. 1, control circuitry 52 is likely to be coupled to most of the other functional components of device 10, in a conventional arrangement, such that control circuitry 12 is capable of interpreting the various control signals applied thereto and drive and control the overall operation of the remaining circuitry in device 10.

It is to be understood that although the various functional components of device 10 depicted in FIG. 1 are shown as separate, discrete circuits disposed in a well-defined spatial relationship with respect to one another, in actual implementation, the various circuits are likely to be dispersed throughout part or all of the semiconductor substrate, with portions of certain functional components being interspersed with one another. That is, FIG. 1 depicts device 10 from a functional perspective rather than an implementation-specific perspective.

Figure 2:
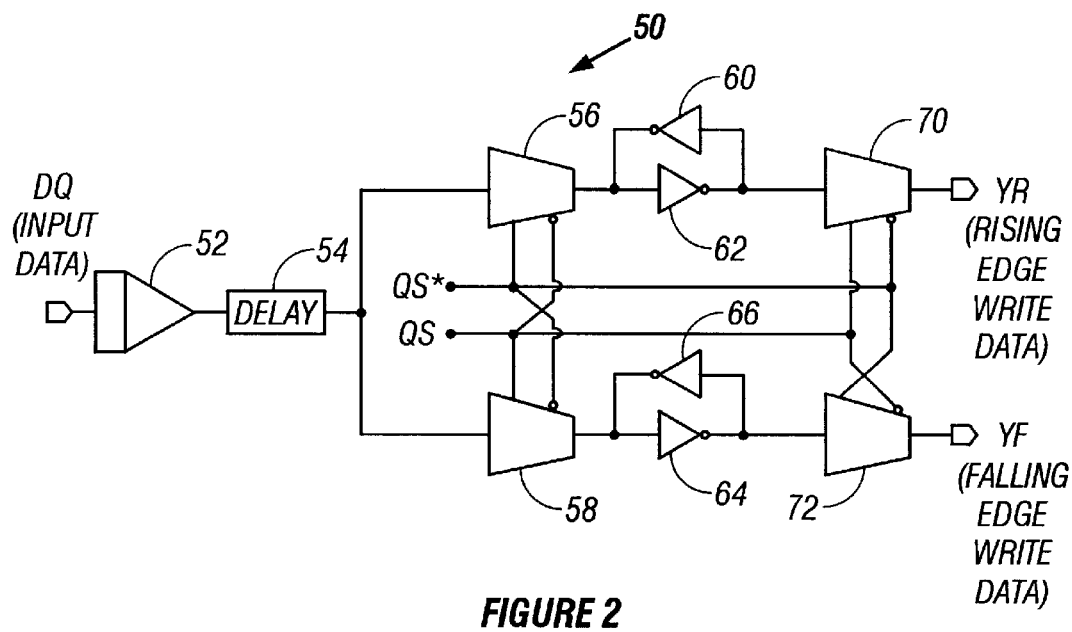
FIG. 2 is a schematic/block diagram of a portion of write data path circuitry in a prior art memory device.

Turning now to FIG. 2, there is shown a simplified schematic diagram of a portion of a prior art write path circuit 50 which might be incorporated into input/output circuit 30 of device 10. In particular, shown in FIG. 2 is a portion of the write path circuit 50 associated with a single one of the eight DQ data input lines DQ0–DQ7; that is, write path circuitry 50 such as is depicted in FIG. 2 would be provided for each of the eight DQ lines DQ0 through DQ7.

As shown in FIG. 2, input buffer 50 comprises an input buffer 52 coupled to the DQ data input pin of device 10. The output of buffer 52 is applied to a delay element 54 adapted to introduce a delay in the propagation of data signals appearing at the output of input buffer 52. Preferably, the delay interval of delay element 54 is variable, and delay element 54 may be implemented in any of various well-known ways, such as with an resistor/capacitor (RC) delay circuit, a succession of inverters, NAND or other logic gates, or some combination thereof, in accordance with common practice in the art. Various delay elements, both fixed and variable, are known in the art; see, for example, U.S. Pat. No. 6,137,334 to Miller Jr. et al., entitled "Logic Circuit Delay Stage and Delay Line Utilizing Same." The Miller Jr. '334 patent is commonly assigned to the assignee of the present invention and is hereby incorporated by reference herein in its entirety.

The delayed data signal presented at the output of delay element 54, in turn, is applied to respective inputs of first and second pass gates 56 and 58. Pass gates 54 and 56 each function to selectively allow the data appearing at their respective inputs to be presented at their respective outputs under control of the data strobe (clock) signal QS/QS* applied to their control inputs. (In accordance with conventional nomenclature, as used herein the presence of an asterisk ("*") following a logical signal denotes the signal's logical (binary) complement.)

As will be appreciated by those of ordinary skill in the art, the data strobe signal QS/QS* is preferably derived from an externally-applied clock (CLK) signal that is among those mentioned above as part of the control signals applied to control circuit 12. In a typical implementation, the data strobe signal QS/QS* is generated by a clocking circuit such as a delay-lock-loop (DLL) circuit described generally above, and which for the purposes of the present disclosure is considered part of the control circuit 12. As such, the QS/QS* signal will likely closely follow the externally-applied CLK signal, possibly with a propagation delay with respect to the externally-applied CLK signal. (For clarity, the connections between such clocking circuitry in control circuit 12 and the various synchronous subcircuits of device 10 are not shown in FIG. 1. Those of ordinary skill in the art will appreciate the necessity and nature of such signal routing.)

Figure 3:
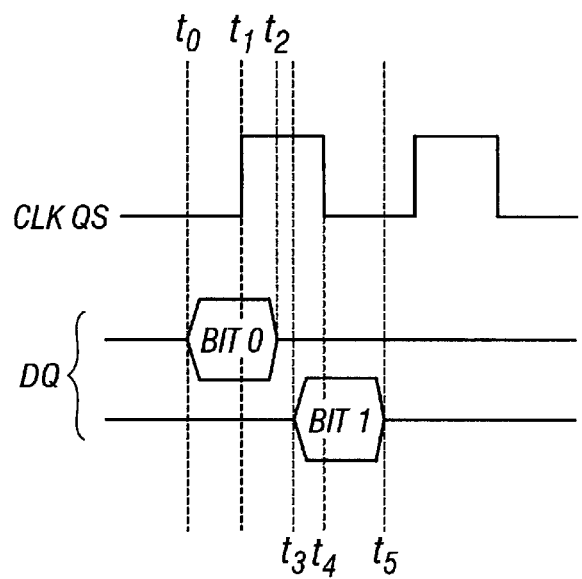
FIG. 3 is a timing diagram illustrating the timing of certain logic signals present in the write data path circuitry from FIG. 2.

As a result of the arrangement shown in FIG. 2, those of ordinary skill will observe that upon the occurrence of a rising edge in data strobe signal QS (and hence a falling edge in the complementary data strobe signal QS*), such as is shown occurring at time $t_0$ in FIG. 3, the delayed data signal output from delay element 54 will pass through to the output of pass gate 56 (i.e., pass gate 56 will "open") but will be blocked from passing through to the output of pass gate 58 (i.e., pass gate 58 will "close"). Conversely, upon the occurrence of a falling edge in data strobe signal QS (and hence a rising edge in complementary data strobe signal QS*), the delayed data signal output from delay element 54 will pass through pass gate 58 (i.e., pass gate 58 will open) and will be blocked by pass gate 56 (i.e., pass gate 56 will close). Because of the complementary nature of strobe signals QS and QS* and as a result of the arrangement shown in FIG. 2, pass gate 56 will not pass data when pass gate 58 does, and, conversely, pass gate 58 will not pass data when pass gate 56 does.

The output of pass gate 56 is presented to a buffer/boost feedback circuit comprising two inverters 60 and 62. Likewise, the output of pass gate 58 is presented to a buffer/boost feedback circuit comprising two inverters 64 and 66. Buffer/boost feedback circuits merely function to improve the overall latching operation of circuit 50 by boosting the outputs of the respective pass gates with which they are associated, as would be appreciated by those of ordinary skill in the art.

Next, the boosted output of pass gate 56 is applied to the input of a pass gate 70, while the boosted output of pass gate 58 is applied to the input of a pass gate 72. Pass gates 70 and 72 receive the complementary data strobe signals QS/QS* and therefore, like pass gates 56 and 58 function essentially as selective pass gates for the outputs of pass gates 56 and 58, respectively.

Turning to FIG. 3, there is shown a timing diagram illustrating operation of the write path circuitry 50 of FIG. 2 as it pertains to the issue of achieving acceptable setup and hold times for data relative to the rising and falling edges of the data strobe signal. As noted above, a rising edge in data strobe signal QS occurs at time $t_1$ in FIG. 3. Prior to time $t_1$, at time $t_0$, data first appears on data input line DQ; thus, the interval from time $t_0$ to time $t_1$ corresponds to the setup interval DS for the first bit (bit 0) to be written to device 10. The bit 0 data is removed from data input line DQ at time $t_2$. Thus, the time interval from time $t_0$ to time $t_2$ corresponds to the hold time DH for the bit 0 data.

At time $t_3$, the falling edge data bit (bit 1) to be written to device 10 appears on the DQ input line. The time interval between $t_3$ and $t_4$, when the falling edge of QS occurs, corresponds to the setup time DS for the bit 1 data. Finally, the bit 1 data is removed from the DQ input line at time $t_5$, making the time interval between times $t_4$ and $t_5$ the hold time DH for the bit 1 data. As will be appreciated by those of ordinary skill in the art, varying the delay interval introduced into the DQ data signal by delay element 54 will result in variation in the timing of the data applied to the inputs of pass gates 56 and 58 relative to the rising and falling edges of data strobe signals QS/QS*, thereby varying the setup and hold times of the data relative to the data strobe signals.

As an illustrative example, assume that a combined setup and hold time for memory device 10 is specified to be no greater than 1 nSec, i.e., DS+DH≦1 nSec. Assume further that the following timing is observed in the example shown in FIG. 3:

For Bit 0 (Rising Edge Data)
    DS=$t_1$-$t_0$=600 pSec
    DH=$t_2$-$t_1$=200 pSec
    DS+DH=800 pSec For Bit 1 (Falling Edge Data)
    DS=$t_4$-$t_3$=200 pSec
    DH=$t_5$-$t_4$=600 pSec
    DS+DH=800 pSec In this example, since the total DS+DH for each bit is less than 1 nSec, the part technically meets the specification for either individual bit in the DDR write operation. However, those of ordinary skill in the art will appreciate that for the purposes of determining whether a DDR part meets its specification, the worst case values for both setup and hold times are used, regardless of which bit they are associated with. In this example, the worst-case setup is that for bit 0, namely 600 pSec, and the worst case hold is that for bit 1, also 600 pSec. Thus, the worst-case DS+DH is 1200 pSec, which does not meet the hypothetical 1 nSec specification.

Unfortunately, delay element 54, even if adjustable, cannot be used to bring the part into specification, since adjusting delay element 54 to improve the worst case setup will necessarily increase the worst case hold, and vice versa. The present invention seeks to overcome this problem.

Figure 4:
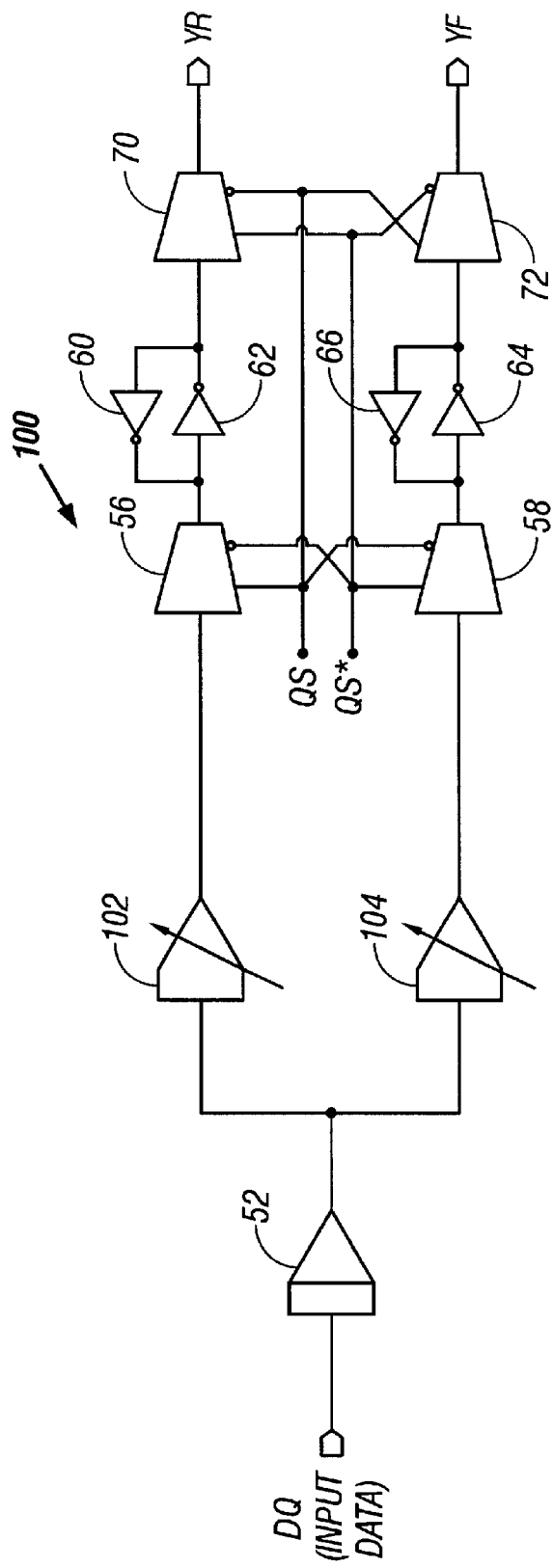
FIG. 4 is a schematic/block diagram of write data path circuitry in accordance with one embodiment of the invention.

Turning to FIG. 4, there is shown a portion of write path circuitry 100 in accordance with one embodiment of the invention. As with FIG. 2, the portion of write path circuitry 100 shown in FIG. 4 is part of input/output circuit 30 in FIG. 1, and, as with FIG. 2, the circuitry 100 in FIG. 4 is provided for each input/output (DQ) pin of device 10. It is to be noted that elements of write path circuitry 100 in FIG. 4 that are essentially identical to corresponding elements in write path circuitry 50 in FIG. 2 retain identical reference numerals in FIG. 4.

As shown in FIG. 4, write path circuitry 100 comprises the same input buffer 52, the same pass gates 56, 58, 70, and 72 and the same buffer/boost inverter pairs 60/62 and 64/66 as circuit 50 from FIG. 2. In addition, however, circuit 100 incorporates a pair of adjustable delay elements 102 and 104. Like delay element 54 in the circuit of FIG. 1, delay elements 102 are adapted to introduce a delay into the propagation of data signals applied to their inputs in a conventional manner. The delayed data signal output of adjustable delay 102 is applied to the input of pass gate 56, whereas the delayed data signal output of adjustable delay 104 is applied to the input of pass gate 58. It will be apparent to those of ordinary skill in the art that by providing separate delays for the rising edge data path (pass gates 56 and 70) and the falling edge data path (pass gates 58 and 72), the delay in the arrival of the DQ data signal at the input of pass gate 56 can be different than the delay in the arrival of the DQ data signal at the input of pass gate 58. Thus, in accordance with an important feature of the present invention, the worst-case setup and hold times for rising edge data can be optimized independently from the worst-case setup and hold times for the falling edge data.

In an alternative embodiment of the invention, an additional variable delay element (not shown in FIG. 4) is provided at the output of data buffer 52. Adjustment of such a delay element's delay interval would introduce a delay in the propagation of both the rising and falling edge data, just as does delay element 54 in the write path circuit of FIG. 1.

Although the embodiment of FIG. 4 overcomes the problems arising from the inability to improve the worst-case setup and hold timings independently for the rising and falling edge bits during a DDR write operation, it may be undesirable to provide two separate delay elements for each data line, due to the amount of area such delay elements might occupy on the semiconductor substrate. To address this consideration, an alternative embodiment of the invention, shown in FIG. 5, is contemplated.

Figure 5:
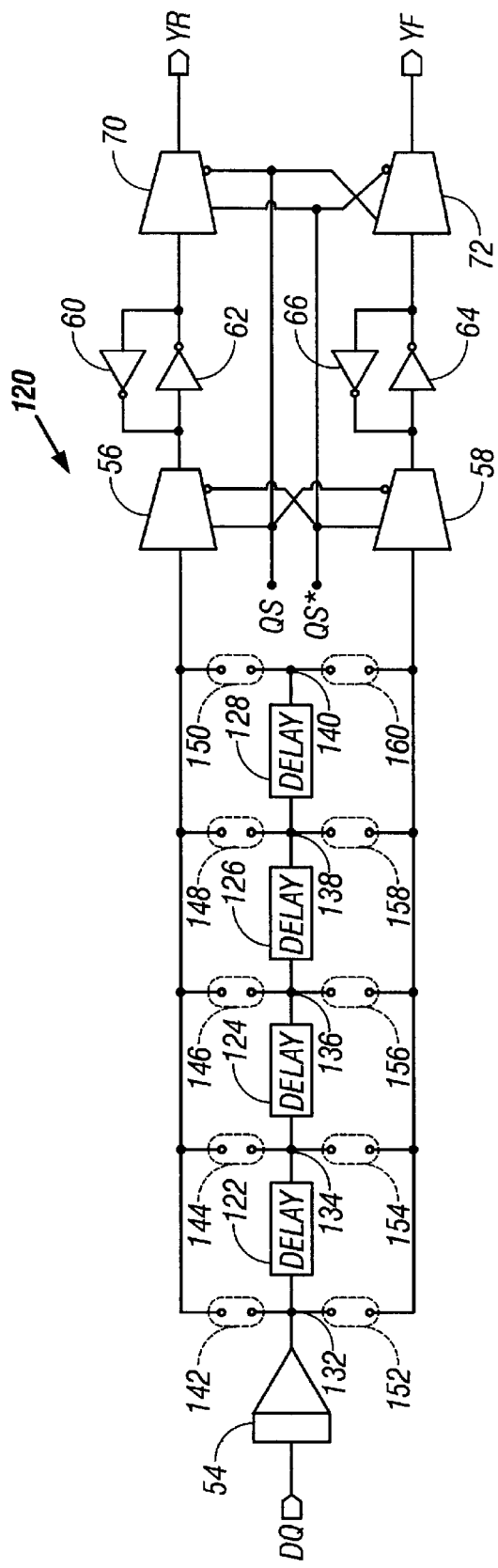
FIG. 5 is a schematic/block diagram of write data path circuitry in accordance with an alternative embodiment of the invention.

Referring to FIG. 5, there is shown a portion of write path circuitry 120 associated with an input/output (DQ) line in the memory device 10 of FIG. 1. It is to be understood that elements in write path circuit 120 which are essentially identical to those in FIGS. 1 and 4 retain identical reference numerals in FIG. 5. As shown, circuit 120 comprises data input buffer 54, pass gates 56, 58, 70, and 72, and bufffer/boost inverter pairs 60/62 and 64/66 as in the embodiments of FIGS. 1 and 4.

In addition, write path circuit 120 comprises a network of series-connected delay elements 122, 124, 126, and 128 coupled to the output of data buffer 54. (Although four delay elements are shown in the embodiment of FIG. 5, those of ordinary skill in the art having the benefit of the present disclosure will readily appreciate that more or fewer delay elements may be utilized.) In one embodiment, series-connected delay elements 122, 124, 126, and 128 are fixed delay elements, for example, implemented in the form of one or more field effect transistor gates, as would be familiar to those of ordinary skill in the art. In one embodiment, delay elements 122, 124, 126, and 128 each introduce the same amount of delay into signal propagation.

As shown in FIG. 5, a plurality of tap points 130, 132, 134, 136, 138, and 140 are defined on either end of and between successive pairs of the series-connected delay elements 122, 124, 126, and 128. Each tap point 130–140 is capable of being shunted either to the input of rising edge data pass gate 56 or to the input of falling edge data pass gate 58. The possible shunt locations are identified with reference numerals 142–160 in FIG. 5. Depending upon which shunts are selected, zero or more of the delay elements 122, 124, 126, and 128 are coupled between the output of buffer 54 and either the input of pass gate 56 (in the case of shunt locations 142–150) or the input of pass gate 58 (in the case of shunt locations 152–160). In one embodiment, the shunts are selected are mask options that are selected during fabrication of the device. Alternatively, it is contemplated that the shunts could be implemented as anti-fuses or the like. In any case, those of ordinary skill in the art will observe from FIG. 5 that shunts 142–150 will result in different delay values for the rising edge data before application to pass gate 56, whereas shunts 152–160 will result in different delay values for the falling edge data before application to pass gate 58. In the embodiment of FIG. 5, at least one tap 142–150 must be made and at least one shunt 152–160 must be made for proper operation.

In the disclosed embodiment, each series-connected delay element 122, 124, 126, and 128 introduces one "unit" of delay into signal propagation. (Although it is contemplated in an alternative embodiment that delay elements may each introduce different amounts of delay into signal propagation. For example, delay elements 122, 124, 126, and 128 may correspond to successively smaller or successively larger delays.) For the rising edge bit, shunt 142 between tap point 132 and pass gate 56 would result in no delay in the DQ data before propagation to pass gate 56. Shunt 144 would result in the introduction of one unit of delay (delay element 122) into propagation of the DQ data. Shunt 146 would result in the introduction of two units of delay (delay elements 122 and 124) into DQ signal propagation. Shunt 148 would result in the introduction of three units of delay (delay elements 122, 124, and 125) into signal propagation. Finally, shunt 150 would result in the introduction of four units of delay (delay elements 122, 124, 126, and 128) into DQ signal propagation. Likewise, zero, one, two, three, or four units of delay can be introduced into propagation of falling edge data, depending upon whether shunt 152, 154, 156, 158, or 160, respectively, is made. Advantageously, although separate and different delays are achieved for the rising and falling edge data, the same delay elements 122, 124, 126, and 128 are utilized for both rising and falling edge delay, thereby conserving chip space.

From the foregoing detailed description of specific embodiments of the invention, it should be apparent that write path circuitry for a double-data-rate synchronous DRAM has been disclosed in which the setup and hold times for the write data is independently adjustable for rising and falling edge data. Although specific embodiments of the invention have been disclosed herein in some detail, this has been done solely for the purposes of describing various features and aspects of the invention, and is not intended to be limiting with respect to the scope of the invention. It is contemplated that various substitutions, alterations, and/or modifications may be made to the disclosed embodiment, including but not limited to those implementation variations which may have been suggested herein, may be made to the disclosed embodiments without departing from the spirit and scope of the invention as defined by the appended claims, which follow.

What is claimed is:

1. A synchronous double-data-rate semiconductor device, comprising:
    a memory bank comprising an array of rows and columns of memory cells;
    input/output circuitry coupled between said memory bank and a plurality of external input/output terminals;
    wherein said input/output circuitry comprises a separate write path circuit coupled to each of said plurality of external input/output terminals, each write path circuit comprising:
        an input buffer having a data input and an output;
        a first delay element having an input coupled to said output of said input buffer and having an output, said first delay element responsive to a data signal at the output of said input buffer to generate a first delayed data signal;
        a second delay element having an input coupled to said output of said input buffer and having an output, said second delay element responsive to said data signal at the output of said input buffer to generate a second delayed data signal;
        a first pass gate having an input coupled to said output of said first delay element, an output, and at least one control input;
        a second pass gate having an input coupled to said output of said second delay element, an output, and at least one control input;
        wherein said first pass gate is responsive to a rising edge in at least one data strobe signal applied to said at least one control input thereof to present said first delayed data signal on said first pass gate output in;
        and wherein said second pass gate is responsive to a falling edge in said at least one data strobe signal applied to said at least one control input thereof to present said second delayed data signal on said second pass gate output.

2. A synchronous double-data-rate memory device in accordance with claim 1, wherein said first and second delay elements are adjustable to introduce a range of delay intervals into data signals propagated therethrough.

3. A synchronous double-data-rate memory device in accordance with claim 2, wherein said first and second delay elements are adjusted to achieve a predetermined timed relationship between said first delayed data signal, said second delayed data signal, said rising edge and said falling edge.

4. A synchronous double-data-rate memory device in accordance with claim 1, further comprising:
    a third pass gate having an input coupled to said output of said first pass gate, an output, and at least one control signal input, said third pass gate being responsive to said first delayed data signal on said first pass gate output and to said at least one control data strobe signal to generate a rising edge data signal on an output of said third pass gate; and
    a fourth pass gate having an input coupled to said output of said second pass gate, an output, and at least one control signal input, said fourth pass gate being responsive to said second delayed data signal on said second pass gate output and to said at least one control data strobe signal to generate a falling edge data signal on an output of said fourth pass gate.

5. A synchronous double-data-rate memory device in accordance with claim 1, wherein said at least one data strobe signal comprises a data strobe signal and its logical complement.

6. A synchronous double-data-rate memory device in accordance with claim 5, wherein said data strobe signal is derived from an externally-applied clock signal.

7. A synchronous double-data-rate semiconductor memory device, comprising:

a memory bank comprising an array of rows and columns of memory cells;

input/output circuitry coupled between said memory bank and a plurality of external input/output terminals;

wherein said input/output circuitry comprises a separate write path circuit coupled to each of said plurality of external input/output terminals, each write path circuit comprising:

an input buffer having a data input and an output;

a delay circuit having an input coupled to said output of said input buffer and having a first output and a second output, said delay circuit responsive to a data signal at the output of said input buffer to generate a first delayed data signal on said first output and a second delayed data signal on said second output;

a first pass gate having an input coupled to said first output of said delay circuit, an output, and at least one control input;

a second pass gate having an input coupled to said second output of said delay circuit, an output, and at least one control input;

wherein said first pass gate is responsive to a rising edge in at least one data strobe signal applied to said at least one control input thereof to present said first delayed data signal on said first pass gate output;

and wherein said second pass gate is responsive to a falling edge in said at least one data strobe signal applied to said at least one control input thereof to present said second delayed data signal on said second pass gate output.

8. A write data path circuit in accordance with claim 7, wherein said first delayed data signal corresponds to said data signal delayed by a first delay interval and said second delayed data signal corresponds to said data signal delayed by a second delay interval different than said first delay interval.

9. A write data path circuit in accordance with claim 8, wherein said first and second delay intervals are adjusted to achieve a predetermined timed relationship between said first delayed data signal, said second delayed data signal, said rising edge, and said falling edge.

10. A write data path circuit in accordance with claim 7, further comprising:

a third pass gate having an input coupled to said output of said first pass gate, an output, and at least one control signal input, said third pass gate being responsive to said first delayed data signal on said first pass gate output and to said at least one control data strobe signal to generate a rising edge data signal on an output of said third pass gate; and a fourth pass gate having an input coupled to said output of said second pass gate, an output, and at least one control signal input, said fourth pass gate being responsive to said second delayed data signal on said second pass gate output and to said at least one control data strobe signal to generate a falling edge data signal on an output of said fourth pass gate.

11. A write data path circuit in accordance with claim 7, wherein said at least one data strobe signal comprises a data strobe signal and its logical complement.

12. A write data path circuit in accordance with claim 11, wherein said data strobe signal is derived from an externally-applied clock signal.

13. A write data path circuit in accordance with claim 7, wherein said delay circuit comprises:

a plurality of series-connected delay elements coupled to said input buffer output, said plurality of series-connected delay elements defining a plurality of tap points between successive pairs of said delay elements;

wherein said first delay circuit output is coupled to a first of said tap points and said second delay circuit output is coupled to a second of said tap points.

14. A write data path circuit in accordance with claim 13, wherein said first of said tap points and said second of said tap points are the same tap point.

* * * * *